United States Patent
Kwak

(10) Patent No.: US 8,045,382 B2
(45) Date of Patent: Oct. 25, 2011

(54) FLASH MEMORY DEVICES AND ERASING METHODS THEREOF

(75) Inventor: Dong-Hun Kwak, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 174 days.

(21) Appl. No.: 12/352,636

(22) Filed: Jan. 13, 2009

(65) Prior Publication Data

US 2009/0190403 A1 Jul. 30, 2009

(30) Foreign Application Priority Data

Jan. 28, 2008 (KR) ........................ 10-2008-0008691

(51) Int. Cl.
*G11C 16/04* (2006.01)
*G11C 16/16* (2006.01)
*G11C 16/06* (2006.01)

(52) U.S. Cl. .......... 365/185.11; 365/185.33; 365/185.18

(58) Field of Classification Search .................. None
See application file for complete search history.

(56) References Cited

U.S. PATENT DOCUMENTS

| | | | |
|---|---|---|---|
| 5,122,985 A * | 6/1992 | Santin | 365/185.19 |
| 7,224,613 B2 | 5/2007 | Chen et al. | |
| 2005/0276120 A1* | 12/2005 | Hsia et al. | 365/185.33 |
| 2007/0076490 A1* | 4/2007 | Kurata et al. | 365/185.29 |
| 2010/0128523 A1* | 5/2010 | Yip | 365/185.03 |

FOREIGN PATENT DOCUMENTS

| | | |
|---|---|---|
| JP | 10-228784 | 8/1998 |
| KR | 1020010037589 A | 5/2001 |
| KR | 1020040008529 A | 1/2004 |

* cited by examiner

*Primary Examiner* — Hoai V Ho
*Assistant Examiner* — James G Norman
(74) *Attorney, Agent, or Firm* — Myers Bigel Sibley & Sajovec

(57) ABSTRACT

Disclosed is an erasing method for a flash memory device that includes erasing memory cells of a selected memory block and post-programming the erased memory cells to have a threshold voltage distribution with the lowest level that is at or near 0V. The post-programming includes first post-programming the memory block in the unit of memory block and second post-programming the memory block in the unit of word line.

18 Claims, 12 Drawing Sheets

FLASH MEMORY DEVICES AND ERASING METHODS THEREOF

CROSS-REFERENCE TO RELATED APPLICATIONS

This U.S. non-provisional patent application claims priority under 35 U.S.C. §119 to Korean Patent Application No. 10-2008-0008691 filed on Jan. 28, 2008, the entire contents of which are incorporated herein by reference.

BACKGROUND

The present invention disclosed herein relates to semiconductor devices and particularly, to nonvolatile memory devices and methods of operation thereof.

Semiconductor memory devices may be generally classified into volatile and nonvolatile types.

Volatile semiconductor memory devices may provide high read and write rates, but generally may lose their data when there is no power supply. Nonvolatile semiconductor memory devices are able to retain their data even without power supply. Thus, the nonvolatile semiconductor devices are widely used in applications requiring data retentivity regardless of power supply. There are many kinds of nonvolatile semiconductor memories including mask read-only memories (MROMs), programmable ROMs (PROMs), erasable and programmable ROMs (EPROMs), electrically erasable and/or programmable ROMs (EEPROMs), among others.

Generally, it may be inconvenient for users to update information from MROMs, PROMs, and EPROMs because those memories are not easily erased and written with data systemically in themselves. In contrast, EEPROMs may be electrically erased and written with data and are increasing used for subsidiary storage units or system programming tools that necessitate steady data updates. Flash EEPROMs can be fabricated in higher integrating density than traditional EEPROMs, which may be useful in applications with large capacity subsidiary memory units. One type of the flash EEPROM, NAN D-type flash EEPROMs (hereinafter, referred to as 'NAND flash memories'), may be more advantageous to integration density than other types of the flash EEPROMs.

In flash memories, an available programmed state of a memory cell is determined by the number of bits stored in the memory cell. A memory cell storing 1-bit data (or a single data bit) is referred to as 'single-bit cell' or 'single-level cell' (SLC). A memory cell storing multi-bit data (or two or more data bits) is referred to as 'multi-bit cell', 'multi-state cell', or 'multi-level cell' (MLC). With increasing demands for high-density memory devices in recent years, significant interest has been generated regarding multi-level flash memories in which multi-bit data is stored in each memory cell.

Programming flash memory cells may include first erasing the memory cells to have a predetermined threshold voltage (e.g., −3V). Then, a substantial programming operation is conducted for selected memory cells by applying a high voltage (e.g., 20V) to a word line coupled to the selected memory cells.

In an SLC scheme, a programmed memory cell is conditioned in one of two threshold voltage distributions, which correspond to data states '1' and '0', respectively. In contrast, in an MLC scheme, a programmed memory cell is conditioned in one of N threshold voltage distributions, which correspond to N programmed states, respectively. Confining threshold voltage distributions within their respective threshold voltage windows in correspondence each with N programmed states may include densely controlled threshold voltage distributions. For this control, an incremental step-pulse programming (ISPP) scheme is being employed in programming flash memories. According to the ISPP scheme, threshold voltage voltages shift by an increment of a program voltage according to repetition of programming loops. In this regard, by establishing smaller increments of the program voltage, it may be possible to adjust threshold voltage distributions within more densely controlled voltage distributions.

Even with such an ISPP scheme, threshold voltage distributions of programmed states are formed wider than the desired widths of threshold voltage windows due to various reasons. For example, capacitive couplings between adjacent memory cells may cause threshold voltage distributions of programmed states to be narrower in the programming operation. This effect is called 'electric field coupling' or 'F-poly coupling'. Narrower intervals between threshold voltage distributions of programmed states due to the electric field couplings may make it difficult to reliably read cell data. This problem becomes more serious as the number of data bits stored in a unit cell increases. Variation rates of threshold voltages of adjacent memory cells by the couplings are proportional to those of programmed memory cells. Thus, while programming erased memory cells, which have threshold voltage distributions extending from −3V, into other states, threshold voltages of adjacent memory cells may vary with increasing rates.

SUMMARY

Some embodiments of the present invention are directed to erasing methods that minimize variation rates of threshold voltages due to couplings between memory cells in a multi-level flash memory. Some embodiments of such method may include methods of erasing for a flash memory device that include erasing multiple memory cells of a selected memory block and post-programming the erased memory cells to have a threshold voltage distribution with the lowest level that is in a voltage range that is near 0V.

In some embodiments, the lowest level is 0V or a positive voltage that is near 0V. Some embodiments provide that the lowest level is in a voltage range from a negative voltage that is near 0V to 0V.

In some embodiments, post-programming the erased memory cells includes first post-programming the memory cells in the memory block in one operation wherein the memory block is first programmed as a unit and second post-programming the memory cells in the memory block in groups according to word lines, wherein the memory block is second programmed in the unit of a word line.

Some embodiments provide that first post-programming the memory cells includes simultaneously applying a program voltage to all of multiple word lines corresponding to the memory block. In some embodiments, second post-programming the memory cells includes sequentially applying a program voltage to a selected ones of the word lines corresponding to the memory block.

Some embodiments provide that first post-programming the memory cells includes verify reading a result of the first post-programming with a predetermined verifying voltage and second post-programming the memory cells includes verify reading a result of the second post-programming with a predetermined verifying voltage. In some embodiments, the verifying voltage is in a voltage range between 0V and a positive voltage near 0V.

Some embodiments provide that if there is an increase of voltage gap between a level of a control signal for controlling a precharging level of a selected bit line during a precharging period of the verify reading and a level of the control signal applied during a sensing period of the verify reading, the verifying voltage is recognized as a negative voltage.

In some embodiments, during the precharging period, the verifying voltage is decreased and the level of the control signal applied is increased. Some embodiments provide that, during the sensing period, the verifying voltage is decreased and the level of the control signal applied is decreased.

Some embodiments of the present invention include a flash memory device that includes a memory cell array including multiple memory blocks, wherein each of the memory blocks includes multiple memory cells and a control circuit that is operable to control a post-programming operation of erased memory cells to have a threshold voltage distribution with a lowest level that is in a voltage range that is near 0V. Some devices include a voltage generator that is operable to generate multiple voltages that are used for the post-programming operation and a verify reading to the post-programming operation in response to control by the control circuit and a read/write circuit that is operable to conduct the post-programming operation and verify reading in response to control by the control circuit.

In some embodiments, the lowest level is in a voltage range from 0V to a positive voltage that is near 0V. Some embodiments provide that the lowest level is in a voltage range from a negative voltage near 0V to 0V.

In some embodiments, the control circuit is further operable to conduct a first post-programming for the memory block as a unit of memory block, wherein the first post-programming is conducted for each of the memory cells corresponding to the memory block as a unit. Some embodiments further provide that the control circuit is further operable to conduct a second post-programming for the memory block as a unit of each of multiple word lines, wherein the second post-programming is conducted for each of the memory cells corresponding to the memory block corresponding to each of the word lines.

In some embodiments, the control circuit controls the first post-programming to simultaneously apply a program voltage to all of the plurality of word lines of the memory block. Some embodiments provide that the control circuit controls the second post-programming to sequentially apply a program voltage to a selected ones of the word lines belonging to the memory block.

Some embodiments provide that the verifying voltage for the verify reading is in a voltage range from 0V to a positive voltage that is near 0V. In some embodiments, if there is an increase of voltage gap between a level of a control signal for controlling a precharging level of a selected bit line during a precharging period of the verify reading and a level of the control signal applied during a sensing period of the verify reading, a verifying voltage for the verify reading includes a negative voltage.

In some embodiments, during the precharging period, the level of the verifying voltage decreases and the level of the control signal applied increases.

A further understanding of the nature and advantages of the present invention herein may be realized by reference to the remaining portions of the specification and the attached drawings.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention.

DETAILED DESCRIPTION OF PREFERRED EMBODIMENTS

Figure 1:
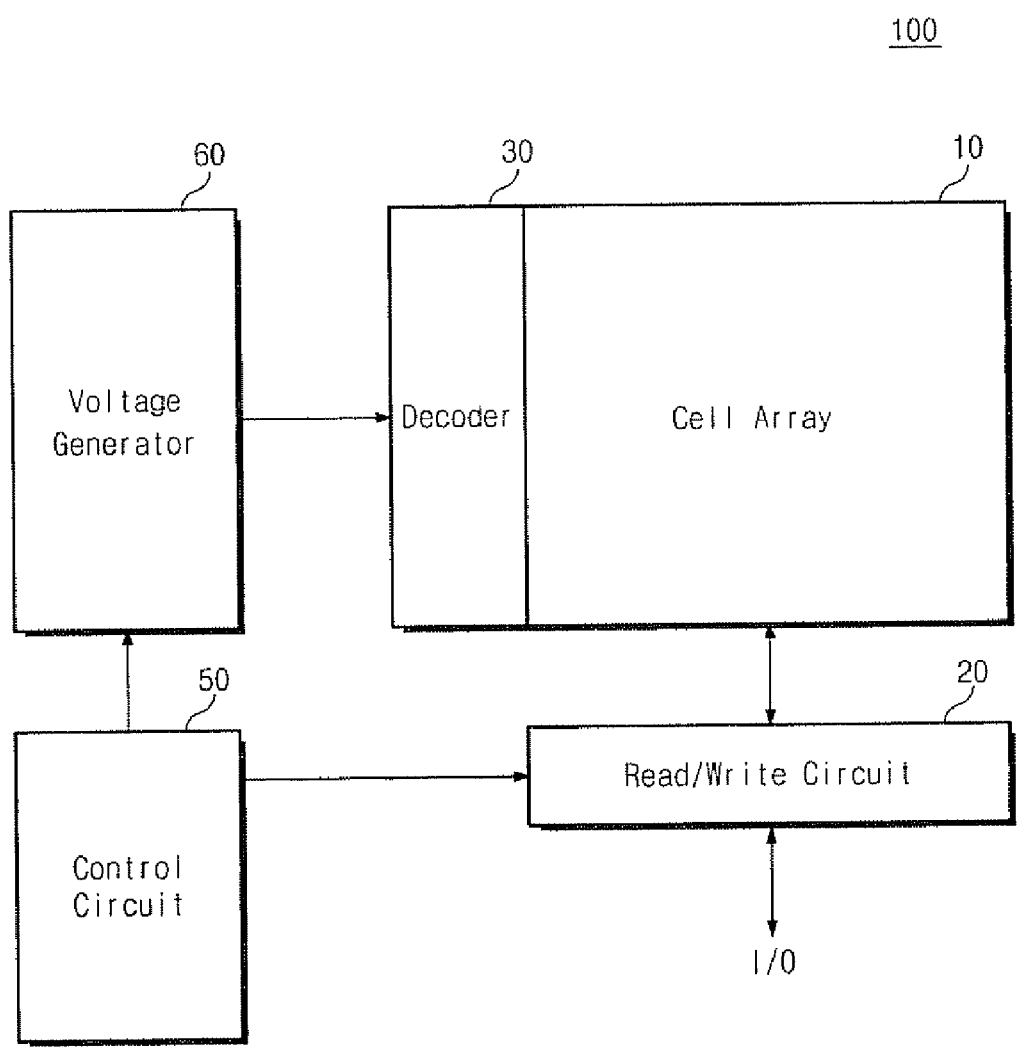
FIG. 1 is a schematic block diagram of a flash memory device according to some embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present invention. In addition, as used herein, the singular forms "a", "an" and "the" are intended to include the plural forms as well, unless the context clearly indicates otherwise. It also will be understood that, as used herein, the term "comprising" or "comprises" is open-ended, and includes one or more stated elements, steps and/or functions without precluding one or more unstated elements, steps and/or functions. The term "and/or" includes any and all combinations of one or more of the associated listed items.

It will also be understood that when an element is referred to as being "connected" to another element, it can be directly connected to the other element or intervening elements may be present. In contrast, when an element is referred to as being "directly connected" to another element, there are no intervening elements present. It will also be understood that the sizes and relative orientations of the illustrated elements are not shown to scale, and in some instances they have been exaggerated for purposes of explanation. Like numbers refer to like elements throughout.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art.

It should be construed that forgoing general illustrations and following detailed descriptions are exemplified and an additional explanation of claimed inventions is provided.

Reference numerals are indicated in detail in some embodiments of the present invention, and their examples are represented in reference drawings. Throughout the drawings, like reference numerals are used for referring to the same or similar elements in the description and drawings.

Figure 2:
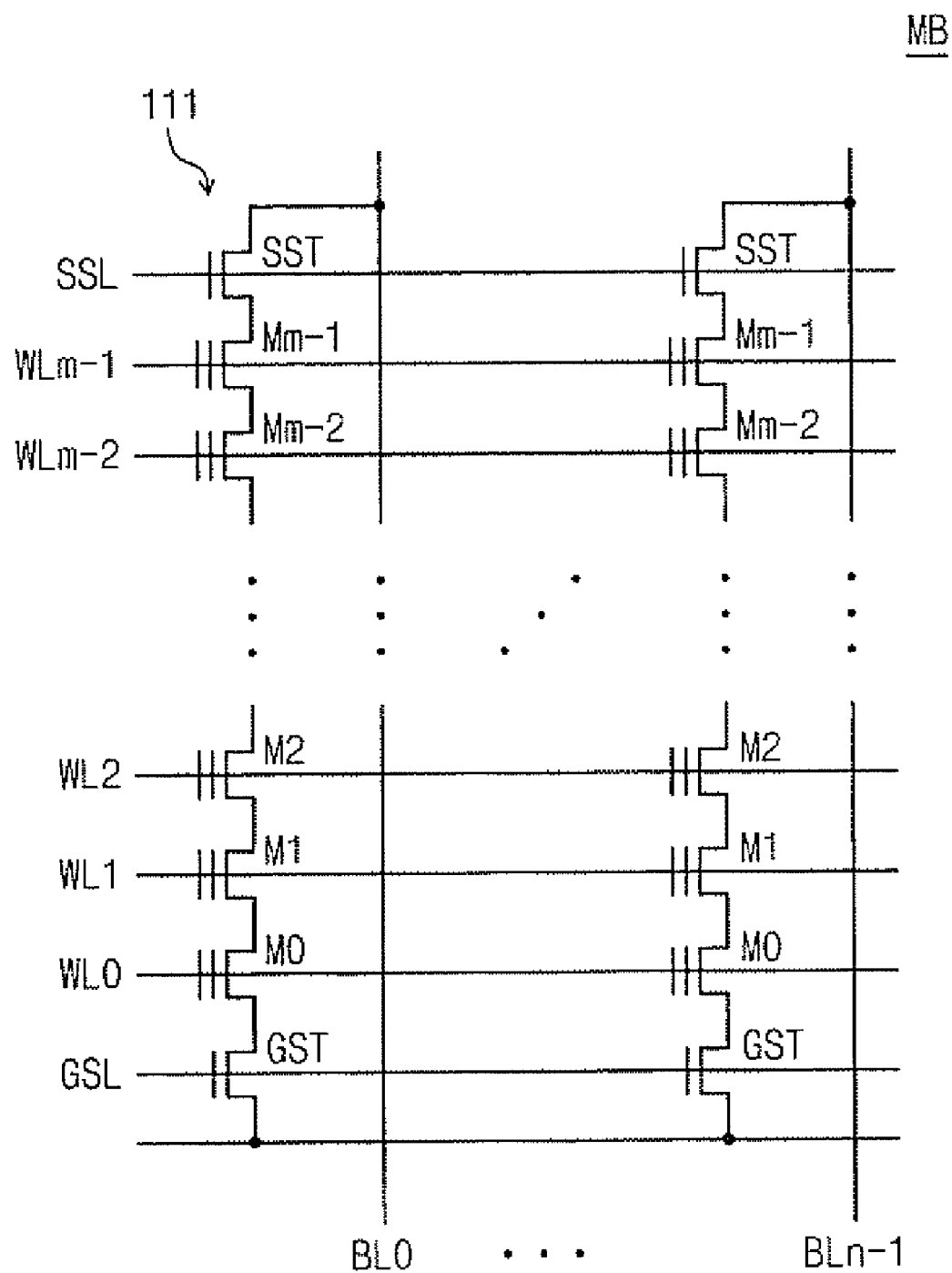
FIGS. 2 and 3 are circuit diagrams of a cell array shown in FIG. 1.
Figure 3:
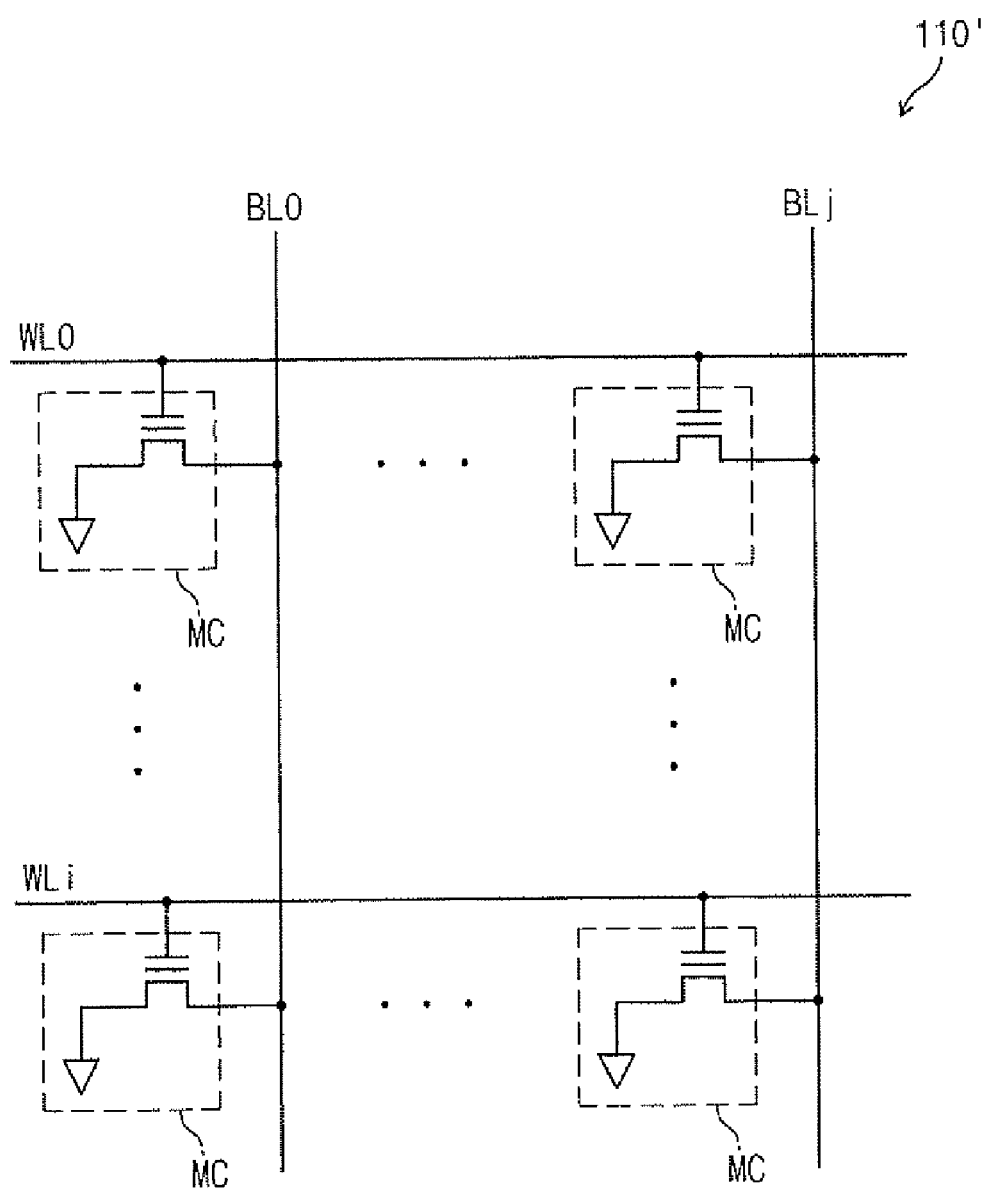

FIG. 1 is a schematic block diagram of a flash memory device 100 according to some embodiments of the present invention. FIGS. 2 and 3 are circuit diagrams of a memory cell array 10 shown in FIG. 1.

Referring to FIGS. 1 through 3, the flash memory device 100 includes the memory cell array 10 that is operable to store N-bit data (N is 2 or a positive integer greater than 2). In some embodiments, a unit memory cell storing N-bit data information is referred to as 'multi-level cell' (MLC).

The cell array 10 includes memory cells arranged on pluralities of rows (or wordlines) and columns (bit lines). The plural memory cells included in the memory cell array 10 constitute pluralities of memory blocks MBs. The memory cells included in the memory block MB may be configured in a NAND string structure as shown in FIG. 2 or configured in a NOR string structure as shown in FIG. 3. As will be described hereinafter, operational characteristics of the flash memory device 100 according to some embodiments of the present invention are applicable to the NAND and NOR memory cells shown in FIGS. 2 and 3. The operational characteristics of the flash memory device 100 according to some embodiments of the present invention are also applicable to a floating-gate flash memory device where a charge storage layer is formed of a conductive floating gate, and/or a charge-trap flash (CTF) memory device where a charge storage layer is formed of an insulation or dielectric film, among others.

As described herein, the MLC flash memory device with the NAND string structure is exemplified as some embodiments according to the present invention. However, the present invention is not limited to any specific configuration of the flash memory. Additionally, it can be seen by those skilled in the art that programming and/or reading characteristics of the flash memory, described hereinafter, may not be limited to the flash memory cells shown in FIG. 1.

Referring to FIG. 2, a unit memory block MB includes pluralities of strings 11 corresponding each to pluralities of columns or bit lines BLn~BLn-1. Each string may include a string selection transistor SST, pluralities of memory cells M0~Mm-1 and a ground selection transistor GST. In the string 111, a drain of the string selection transistor SST is connected to a corresponding bit line. A source of the string selection transistor GST is connected to a common source line CSL. Between a source of the string selection transistor SST and a drain of the ground selection transistor GST, the memory cells M0~Mm-1 may be connected in series. Common gates of the memory cells arranged along the same row are connected to word lines WL0~WLm-1 in common. The string selection transistor SST is controlled by a voltage applied through a string selection line SSL. The ground selection transistor GST is controlled by a voltage applied through the ground selection line GSL. The memory cells M0~Mm-1 are controlled by voltages applied through the word lines WL0~WLm-1. The memory cells coupled each to the word lines WL0~WLm-1 store data corresponding to one or more pages. A programming or reading operation of the NAND flash memory 100 is performed for each page. An erasing operation for programmed data is performed in a block that includes multiple pages.

Returning to FIG. 1, a control circuit 50 operates to control an overall operation relevant to the programming, erasing, and reading operations of the flash memory 100. The flash memory 100 does not overwrite data to flash memory cells. In this regard, the erasing operation is performed before a programming operation in the flash memory 100. The erasing operation according to some embodiments of the present invention includes one main erasing operation and two post-programming operations. The main erasing operation may include multiple erasing loops and two post-programming operations may include multiple programming loops. The main erasing and post-programming operations are operable with erasing and program voltages generated by the ISPP scheme. The erasing or program voltage is used for multiple erasing or programming loops, which can be applied to the memory cells multiple times every erasing and/or programming loop. For example, a level of the erasing or program voltage incrementally increases by a predetermined voltage increment ΔV with the subsequent repeated operations of the erasing or programming loops. The erasing or program voltages used in the erasing or programming loops can be variously modified and/or altered in application times, voltage level, and/or application duration, among others, by external (e.g., a memory controller) and/or internal (e.g., the control circuit 50) control. According to the erasing operation of some embodiments of the present invention, the lowest level of threshold-voltage distribution of erased memory cells may be adjusted to be 0V or near to 0V when used in conjunction with a narrower width of threshold voltage distribution.

A voltage generator 60 generates a voltage to be supplied to a bulk (e.g., well region) in which memory cells are formed, word line voltages (e.g., the program voltage Vpgm), a read voltage Vread, and/or a pass voltage Vpass, which are to be supplied to the word lines in conjunction with operation modes. An operation of the voltage generator 60 is conducted by control of the control circuit 50.

A decoder 30 selects one from memory blocks (or sectors) of the memory cell array 10, responding to control by the control circuit 50, and selects a word line from word lines of the selected memory block. The decoder 30 provides word line voltages to selected and unselected word lines from the voltage generator 60 in response to control by the control circuit 50.

A read/write circuit 20 is controlled by the control circuit 50, which may function as a sense amplifier or a writing driver. For instance, in a verify reading operation or a normal reading operation, the read/write circuit 20 operates as a sense amplifier for reading data from the memory cell array 10. In the normal reading operation, data read by the read/write circuit 20 is output to an external device (e.g., a memory controller or host) through a buffer. In the verify reading operation, instead of outputting to an external device, the readout data is provided to a pass/fail check circuit (not shown) to verify that the programming operation is performed correctly. In particular, the read/write circuit 20 is able to adjust a sensing range of a verifying voltage in the verify reading operation. For example, the read/write circuit 20 according to some embodiments of the present invention is operable to extend the sensing range of the verifying voltage to a negative voltage. In this regard, there is no need for a negative voltage generator. The verify reading operation according to the present invention will be discussed in detail with reference to FIGS. 8 through 11.

The programming operation executed by the read/write circuit 20 is divided into normal programming loops and post programming loops. During the normal programming loop, the read/write circuit 20 receives data, which is to be written into the memory cell array 10, from an input/output buffer and drives bit lines with the input data. For this, the read/write circuit 20 may include multiple page buffers corresponding each to columns (or bit lines) or column pairs (or bit-line pairs).

The post-programming operation is carried out such that after the main erasing operation, the lowest level of an erased threshold voltage distribution is at or near 0V with a narrower width of the threshold-voltage distribution. The program voltage used in the post-programming operation can be generated in the ISPP scheme. Each post-programming operation may be incorporated with a program-verifying operation. Memory cells to be post-programmed are conditioned in an erased state without being programmed with any data. Thus, according to the post-programming operation in some embodiments of the present invention, a variation of the threshold voltage distribution (i.e., the lowest threshold voltage distribution) results corresponding to an erased state without affecting programmed states of a selected memory cell and adjacent memory cells.

If the post-programming operation is carried out in the programming operation, but not in the erasing operation of the flash memory, changing threshold voltages due to capacitive couplings between programmed cells somewhere in a memory block including a selected memory cell may cause a problem. The erasing operation of the flash memory 100 according to some embodiments of the present invention are performed as follows.

Figure 4A:
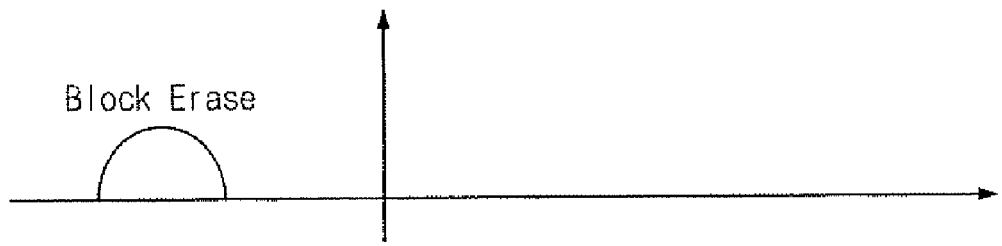
FIGS. 4A~4C and 5A~5C are graphic diagrams illustrating an erasing method according to some embodiments of the present invention.
Figure 4B:
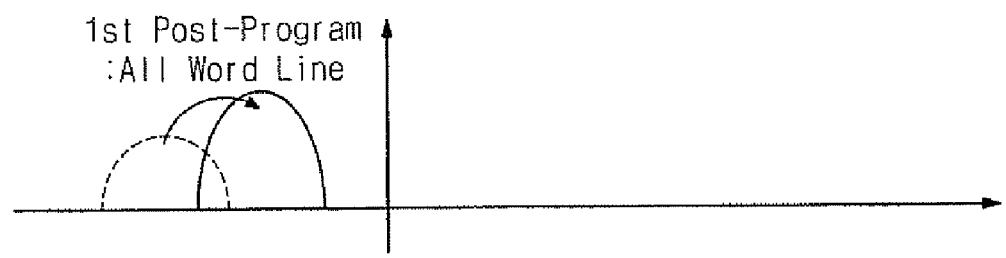
Figure 4C:
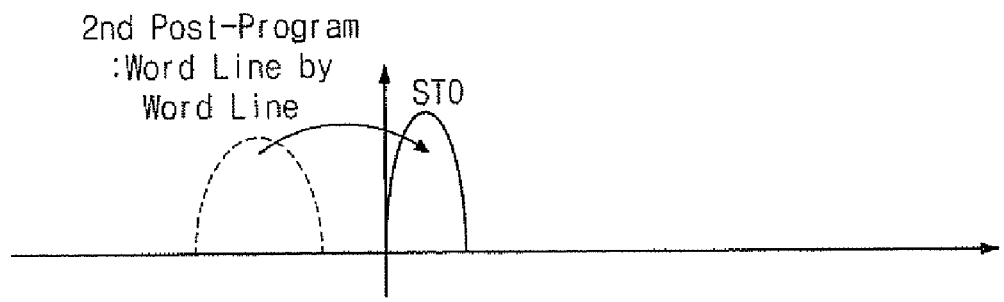
Figure 5A:
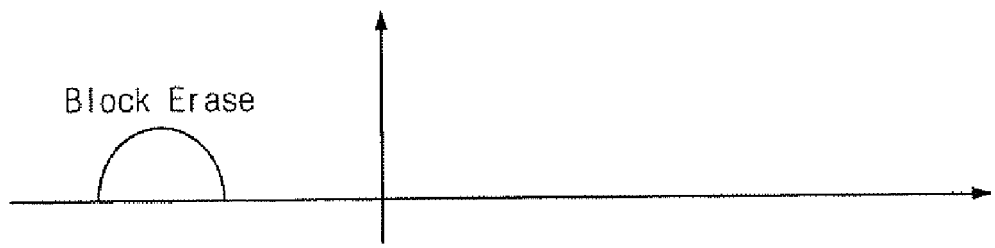
Figure 5B:
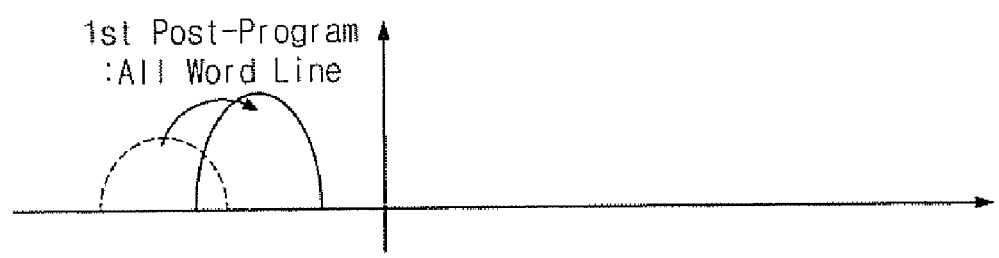
Figure 5C:
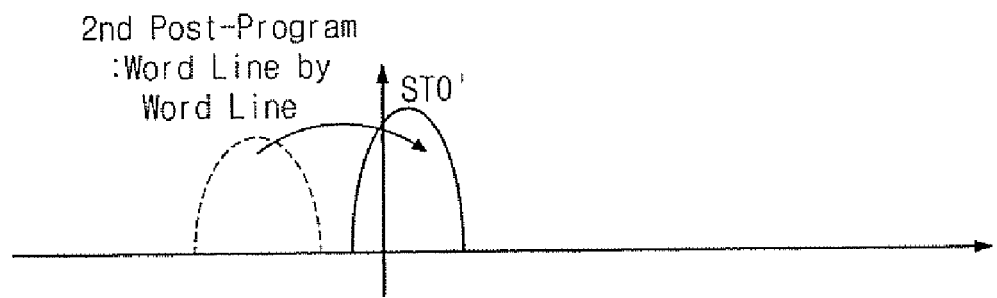

FIGS. 4A~4C and 5A~5C are graphic diagrams illustrating an erasing method according to some embodiments of the present invention. FIGS. 4A~4C show variation of a threshold voltage distribution of erased state in accordance with a first embodiment of the present invention, while FIGS. 5A~5C show variation of a threshold voltage distribution of erased state in accordance with a second embodiment of the present invention.

Referring to FIGS. 4A~4C and 5A~5C, the erasing operation for the flash memory device 100 includes a main erasing operation and a post-programming operation. The post-programming operation may include first and second post-programming operations corresponding to a voltage bias pattern to the word lines.

The main erasing operation is accomplished by applying 0V to control gates and applying a high voltage (e.g., 20V) to a semiconductor substrate. Under this bias condition, the Fowler-Nordheim (F-N) tunneling effect is induced to release negative charges (i.e., electrons) into the semiconductor substrate from floating gates through tunnel oxide films. This mechanism forces an effective threshold voltage Vth of the flash memory cell to be set at a negative voltage (e.g., −3V). Threshold voltage distribution after finishing the main erasing operation is shown in FIG. 4A or 5A.

After the main erasing operation, the first and second post-programming operations begin in response to control by the control circuit 50. A threshold voltage distribution after the first post-programming operation is shown in FIG. 4B or 5B. A threshold voltage distribution after the second post-programming operation is shown in FIG. 4C or 5C.

In the first post-programming operation, the program voltage is applied to all word lines of the erased memory block. Namely, the first post-programming operation is carried out in the memory block and thus may have a shorter programming time. After the first post-programming operation, the lowest level of the threshold voltage distribution corresponding to the erased state becomes at or near 0V. In the second post-programming operation, the program voltage is independently applied to word lines of an erased memory block. After the second post-programming operation, the threshold voltage distribution corresponding to the erased state becomes closer to 0V in the lowest level and narrower in width.

Figure 6:
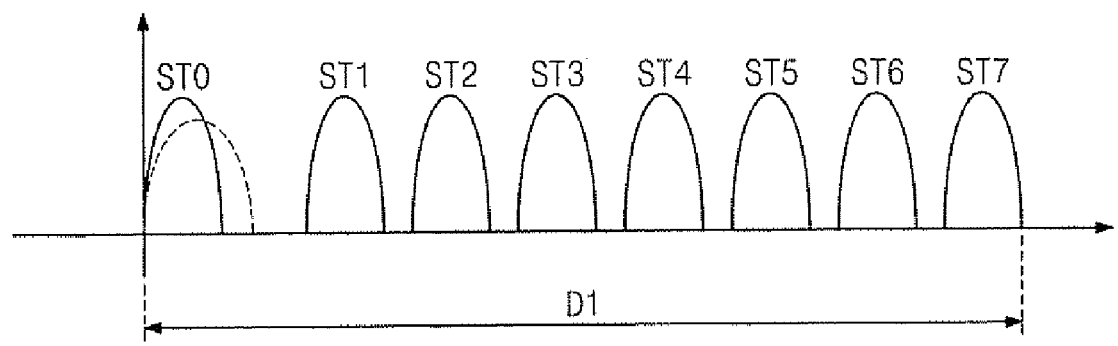
FIGS. 6 and 7 are graphic diagrams illustrating states of memory cells programmed from the erased states shown in FIGS. 4C and 5C.
Figure 7:
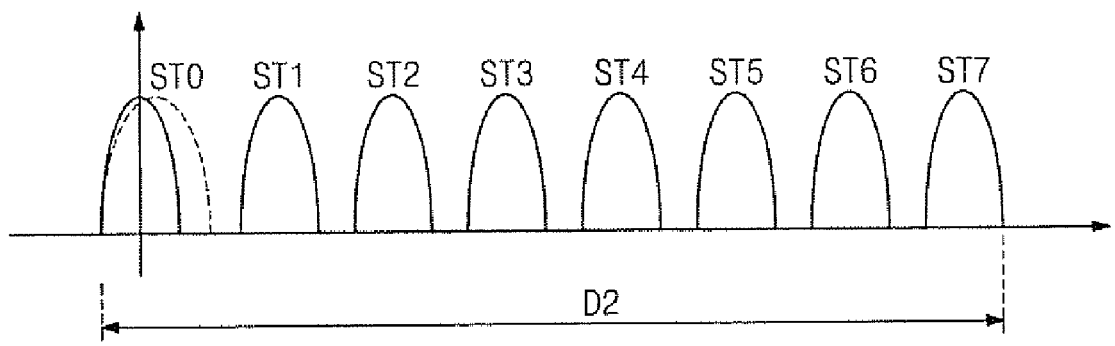

FIGS. 6 and 7 are graphic diagrams illustrating states of memory cells programmed from the erased states ST and ST0' shown in FIGS. 4C and 5C. FIG. 6 shows threshold voltage distributions of the memory cells programmed from the erased states ST0 of FIG. 4C and FIG. 7 shows threshold voltage distributions of the memory cells programmed from the erased states ST0' of FIG. 5C. The broken lines of FIGS. 6 and 7 denote variations of threshold voltages due to capacitive couplings while programming adjacent memory cells.

Referring to FIGS. 6 and 7, the memory cells erased by the erasing method according to the present invention are conditioned in the threshold voltage distribution that has the lowest level near to 0V and a narrow width. If the threshold voltage distribution of the erased state is close to 0V, it lessens a variation rate from the erased state to another programmed state, rather than the case of the normal erasing mode.

Variation rates of threshold voltages between adjacent memory cells due to capacitive couplings may be proportional to those of programmed memory cells. Among multiple programmed states, a programming point with the largest variation rate may occur when programming the memory cells from the erased state into another programmed state. Thus, reducing a variation rate of threshold voltage from the erased state to another programmed state as described above may lessen threshold voltage variations of adjacent memory cells due to capacitive couplings therebetween.

As illustrated in FIGS. 4C and 5C, the threshold voltage distribution of the erased state resulting from the second post-programming operation may be near 0V and may partially include the negative domain. The threshold voltage distribution of the memory cells corresponding to the erased state is close to 0V, the lowest level of the threshold voltage distribution of the erased state may be 0V or a positive voltage that is substantially proximate 0V. If the threshold voltages of the memory cells corresponding to the erased state are partly conditioned in the negative domain, the lowest threshold voltage may be arranged on a negative level that is close to 0V. Although not shown, an erased threshold voltage distribution resulting from post-programming in the erasing operation may be in the negative domain or close to 0V with a partial inclusion in the positive domain.

As shown in FIG. 5C, the threshold voltage distribution of the erased memory cells are partly conditioned in the negative domain and the entire range of programmed states (refer to D2 of FIG. 7) is wider than that (refer to D1 of FIG. 6) corresponding to the erased state of FIG. 4C (i.e., D2>D1). The wider threshold-voltage distribution rage D2 extends margins between the multiple programmed states.

In the post-programming operations, a voltage for verifying the threshold voltage distribution as shown in FIG. 4C may be 0V or a positive voltage proximate 0V. A voltage for verifying the threshold voltage distribution, as shown in FIG.

5C, may be a negative voltage (less than 0V). A NAND flash memory device may be fabricated without an additional negative voltage generator for providing a negative voltage. Therefore, some embodiments of the present invention are directed towards providing an efficient verify reading scheme that is capable of finding a threshold voltage distribution, which may be partly conditioned in the negative domain, using the read/write circuit without an additional negative voltage generator. The read/write circuit 20 and the page buffers 201~204 are configured as follows in reference to FIG. 8, which is a schematic diagram of the read/write circuit 20 shown in FIG. 1.

Figure 8:
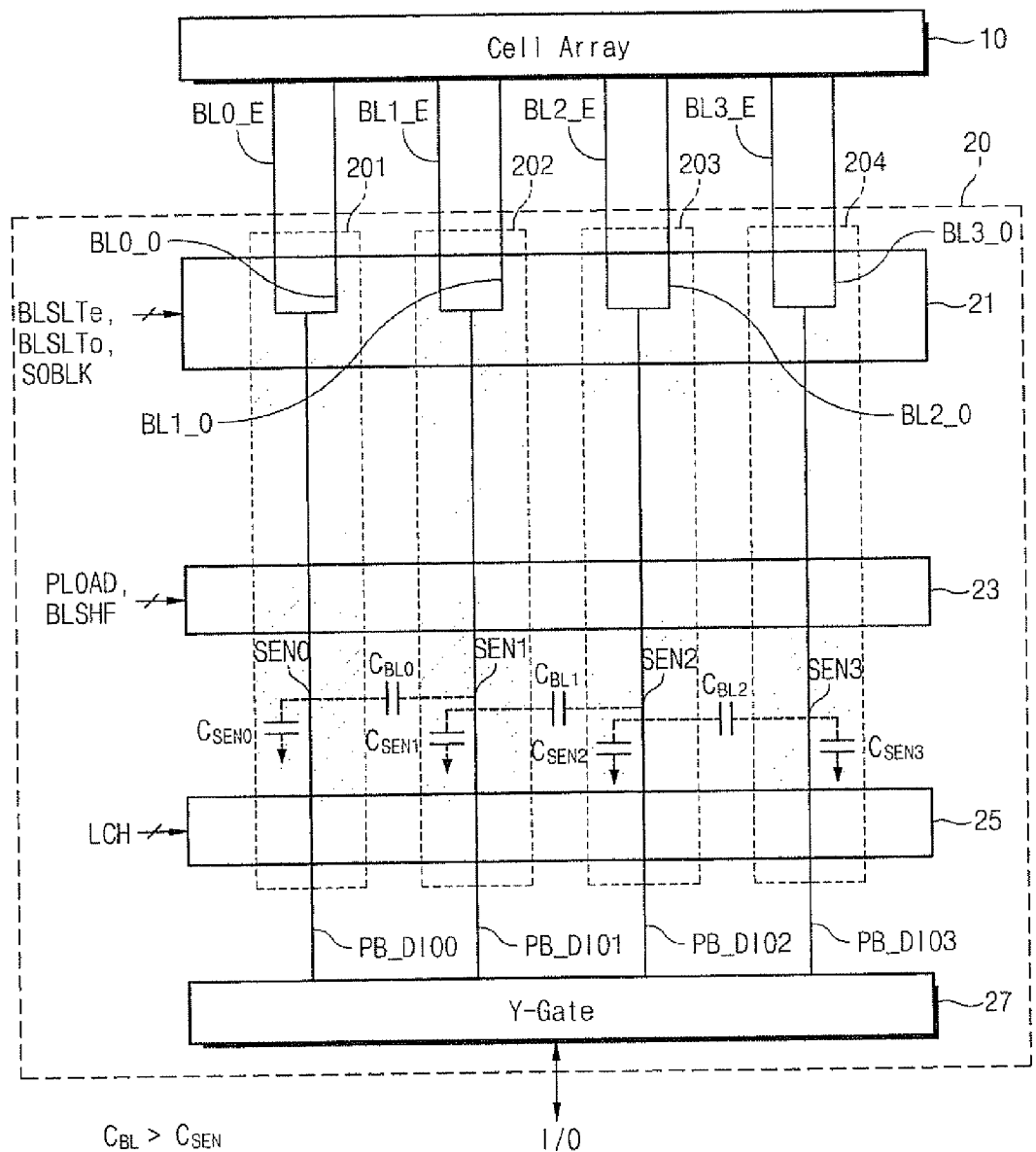
FIG. 8 is a schematic diagram of the read/write circuit shown in FIG. 1.

Referring to FIG. 8, the memory cell array 10 includes pluralities of the cell strings respective to the bit lines. By way of example, FIG. 8 illustrates four bit-line pairs BL0_E/BL0_O, BL1_E/BL1_O, BL2_E/BL2_O, and BL3_E/BL3_O among the multiple bit lines connected to the memory cell array 10.

The read/write circuit 20 includes the page buffers 201, 202, 203, and 204 and a column gate circuit 27. The bit-line pairs BL0_E/BL0_O~BL3_E/BL3_O are electrically connected to the page buffers 201~204, respectively. The page buffers 201~204 operate as sense amplifiers during the read-verifying operation and operate as writing drivers for activating bit lines by data to be programmed in the programming operation. Data inputs/outputs through the page buffers 201~204 are conducted by way of the column gate circuit 27. The page buffers 201~204 are same with respect to each other in circuit structure. Hereinafter the page buffer 201 will be described for explanatory purposes.

Figure 9:
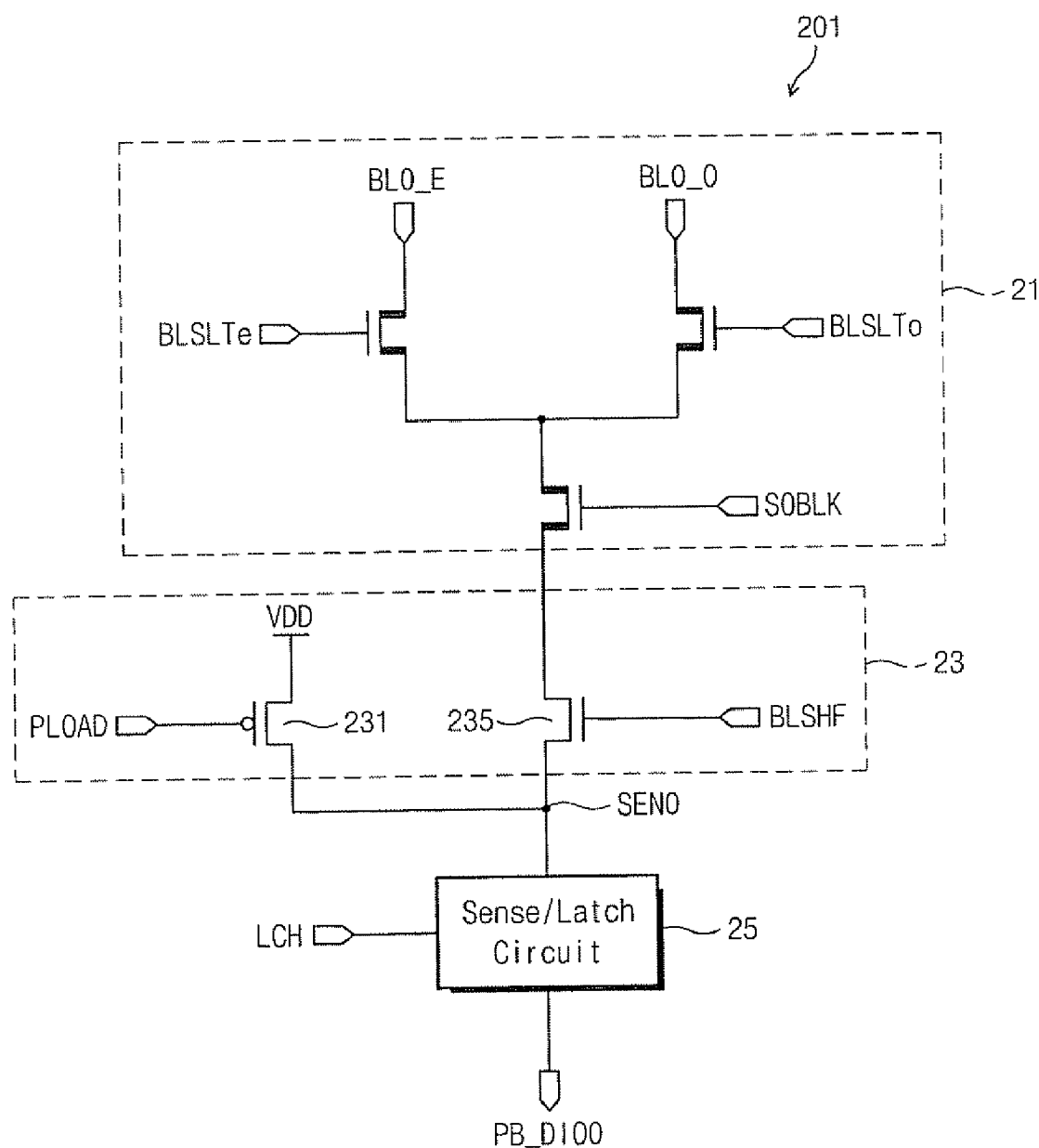
FIG. 9 is a circuit diagram of the page buffer shown in FIG. 5.
Figure 10:
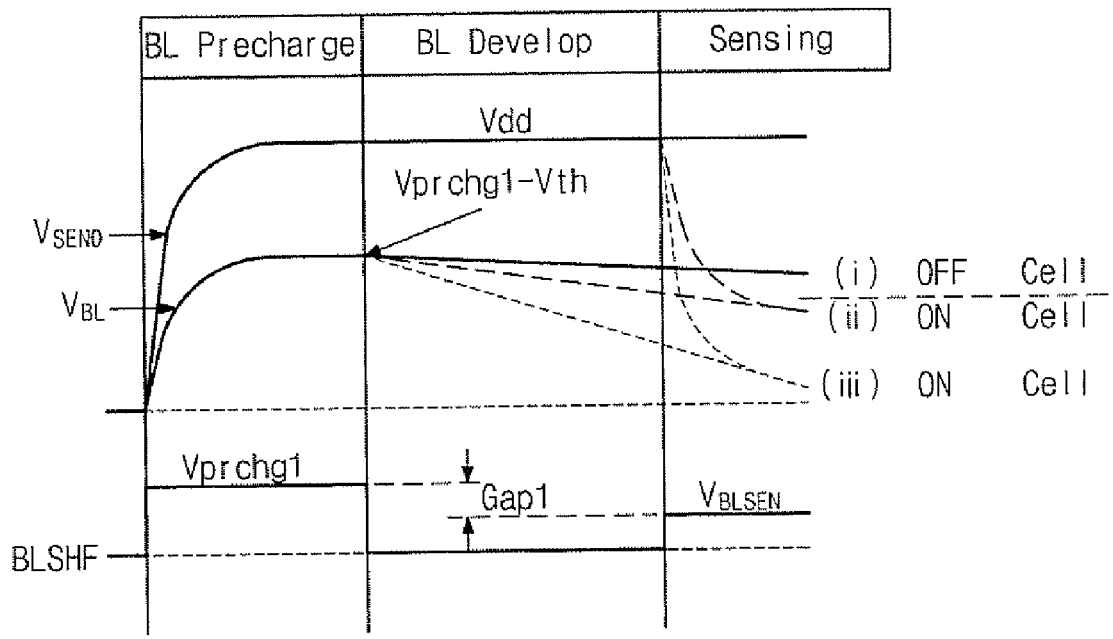
FIGS. 10 and 11 are graphic diagrams illustrating a sensing operation of the page buffer shown in FIG. 9.
Figure 11:
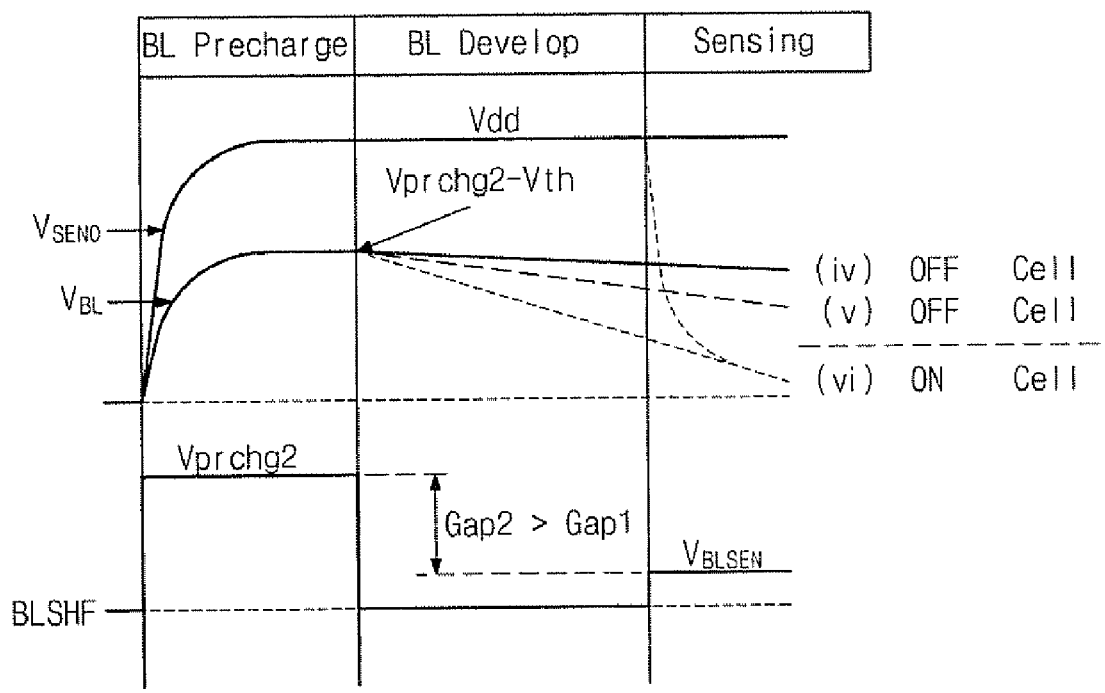

FIG. 9 is a circuit diagram of the page buffer 201 shown in FIG. 8. FIGS. 10 and 11 are graphic diagrams illustrating a sensing operation of the page buffer 201 shown in FIG. 9.

Referring to FIG. 9, the page buffer 201 is organized as a bit-line selection (or selection/bias) circuit 21, a precharging circuit 23, and a sense/latch circuit 25. Between the precharging circuit 23 and the sense/latch circuit 25 is interposed a sensing node SEN0.

The bit-line selection circuit 21 functions to select a bit line (BL0_E or BL0_O; hereinafter, BL0_E) through which data is sensed. The precharging circuit 23 operates to precharge the bit line BL0_E and the sensing node SEN0 before the normal/verify reading operation for memory cells connected to the selected bit line BL0_E. The sense/latch circuit 25 operates to sense and latch a voltage of the sensing node SEN0 as a result of the normal/verify reading operation during a sensing period. Modifications and/or alternative configurations of the bit-line selection circuit 21, the precharging circuit 23, and the sense/latch circuit 25 are within the scope and spirit of the present invention. In this regard, the present invention is not limited to the structures of the bit-line selection circuit 21, the precharging circuit 23, and/or the sense/latch circuit 25 described herein.

As discussed below, the precharging circuit 23 according to some embodiments of the present invention may adjust a sensing range of verifying voltage. For instance, the precharging circuit 23 may extend a sensing rage of verifying voltage to a negative voltage. This functionality is applicable to all of the normal reading operation and verify reading operations. The sensing range of verifying voltage is adjustable without employing an additional negative voltage generator in the flash memory device 100. The detailed configuration and function of the precharging circuit 23 is as follows.

The precharging circuit 23 is composed of PMOS and NMOS transistors 231 and 235 that are controlled by a precharging control signal PLOAD. The PMOS transistor 231 is connected between the power source voltage VDD and the sensing node SEN0 and may respond to the precharging control signal PLOAD through its gate. Responsive to turning-on/off the PMOS transistor 231, the bit line BL0_E and the sensing node SEN0 are precharged accordingly. The NMOS transistor 235 is connected between the selection circuit 21 and the sensing node SEN0, responding to a shut-off control signal BLSHF through its gate. The NMOS transistor 235 functions to electrically connect or isolate the selected bit line BL0_E with the sensing node SEN0. Because of this function, the NMOS transistor 235 may also be referred to as the 'shut-off transistor'.

Referring to FIGS. 9 and 10, the normal/verify reading operation may be performed by including a period (i.e., precharging period) for precharging the selected bit line BL0_E to a predetermined precharging level, a period (i.e., developing period) for developing the precharged bit line, and a period (i.e., sensing period) for sensing and latching a developed result from the sensing node SEN0.

A precharging level of the bit line BL0_E is determined by a voltage level of the shut-off control signal BLSHF applied to the gate of the NMOS transistor 235 and a threshold voltage Vth of the NMOS transistor 235. If a predetermined precharging voltage Vprchg1 as the shut-off control signal BLSHF is applied to the gate of the NMOS transistor 235 and the power source voltage VDD is applied to the sensing node SEN0, the selected bit line BL0_E is precharged to the level of Vprchg1-Vth. In this regard, Vth refers to the threshold voltage of the NMOS transistor 235.

After precharging the bit line BL0_E, 0V is applied to a selected word line and the read voltage Vread (e.g., +4.5V) is applied to unselected word lines. Additionally, 0V as the shut-off control signal BLSHF is applied to the gate of the NMOS transistor 235. Under this voltage bias condition, the selected bit line BL0_E is developed. A result of developing the bit line BL0_E, the sensing node SEN0 is sensed and latched by the sense/latch circuit 25 in the sensing period. During the sensing period, a voltage $V_{BLSEN}$ higher than 0V but lower than the precharging voltage Vprchg1, as the shut-off control signal BLSHF, is applied to the gate of the NMOS transistor 235.

If a selected memory cell is an off-cell, a voltage level of the bit line BL0_E and the sensing node SEN0 is maintained on high level (refer to the plot (i) of FIG. 10) during the developing period. In this case, since a threshold voltage of the selected memory cell is higher than a voltage applied to the corresponding word line, the selected memory cell is turned off and there is little current flow therethrough. Thus, even if the voltage $V_{BLSEN}$ higher than 0V is applied to the gate of the NMOS transistor 235 as the shut-off control signal BLSHF, the NMOS transistor 235 is not turned on to hold the sensing node SEN0 on the level of the power source voltage VDD. During the sensing period, the voltage $V_{BSLEN}$ acting as the shut-off control signal BLSHF is lower than the precharging voltage Vprchg1 by Gap1 as shown in FIG. 10. Namely, Gap1 refers to a difference between the voltage Vprchg1 of the shut-off control voltage BLSHF applied during the precharging period and the voltage $V_{BLSEN}$ of the shut-off control signal BLSHF applied during the sensing period.

If a selected memory cell is an on-cell, a voltage level of the bit line BL0_E and the sensing node SEN0 falls down to low level (refer to the plots (ii) and (iii) of FIG. 10) during the developing period. In this case, a threshold voltage of the selected memory cell is lower than a voltage applied to its corresponding word line and the selected memory cell is turned on. A voltage of the selected bit line BL0_E is below $V_{BLSEN}$-Vth from Vprchg1-Vth. During the sensing period, if the voltage $V_{BLSEN}$ that is higher than 0V is applied to the gate of the NMOS transistor 235 as the shut-off control signal BLSHF, the NMOS transistor 235 is turned on to reduce a voltage of the sensing node SEN0 to the voltage level of the selected bit line BL0_E. The plots (ii) and (iii) shown in FIG. 10 depict voltage levels of the selected bit line BL0_E and the sensing node SEN0, respectively, when the selected memory cell is an on-cell. The plot (ii) represents a case that there is a small amount of discharged current due to the higher threshold voltage Vth of the selected memory cell than that illustrated in the plot (iii).

The reading scheme illustrated by the timings shown in FIG. 10 can be adapted to the normal/verify reading operation for the programmed states of the MLC except for the erased states shown in FIGS. 6 and 7. Further, the reading scheme according to FIG. 10 can be also adapted to the normal/verify reading operation for an erased state that includes the threshold voltage distribution close to 0V as shown in FIG. 4. In this case, a level of verifying voltage may be 0V or a positive voltage that is near 0V. If a threshold voltage distribution of the erased memory cells is partly conditioned in the negative domain as shown in FIG. 5, it may be necessary for the normal/verify reading operation to be facilitated by extending a sensing range of the verifying voltage into the negative domain. A mechanism for extending a sensing range of verifying voltage into the negative domain is as follows.

Referring to FIGS. 8 and 9, a correlation between a threshold voltage of a selected memory cell and a voltage applied to a selected word line restricts an amount of current discharged from a selected bit line (e.g., BL0_E or BL0_O). By increasing a voltage gap of the shut-off control signal BLSHF by periods of the normal/verify reading operation, a sensing range for turning on/off the memory cell may be adjusted. The voltage gap during the normal/verify reading operation may provide a difference between a voltage level of the shut-off control signal BLSHF applied to the gate of the NMOS transistor 235 during the precharging period and a voltage level of the shut-off control signal BLSHF applied to the gate of the NMOS transistor 235 during the sensing period.

Such an adjustment for the turn-on/off of the memory cell results in an effect of extending a sensing range of a verifying voltage to a negative voltage. In this case, the flash memory device according to some embodiments of the present invention is operable by varying a voltage gap of the shut-off control signal BLSHF in the different periods without an additional voltage generator for a negative verifying voltage. Some embodiments include adjusting a sensing range of a verifying voltage as follows.

Referring still to FIG. 10, a time sequence for which the shut-off control signal BLSHF has the voltage gap Gap1 illustrated by period in the normal/verify reading operation, while FIG. 11 shows a time sequence for which the shut-off control signal BLSHF has another voltage gap Gap2 (Gap2>Gap1) illustrated by period in the normal/verify reading operation. Here, Gap2 refers to a difference between a voltage Vprchg2 of the shut-off control signal BLSHF applied during the precharging period and the voltage $V_{BLSEN}$ of the shut-off control signal BLSHF applied during the sensing period.

In order to make a selected memory cell read out as an off-cell, a bit line voltage $V_{BL}$ of the sensing period must be higher than $V_{BLEN}$-Vth. In other words, the increased voltage gap Gap2 of the shut-off control signal BLSHF is adjusted to be higher than $V_{BLEN}$-Vth. As a result, a programmed state of a memory cell, which has been detected as an on-cell by the plot (ii) of FIG. 10, is identified as an off-cell by the plot (v) of FIG. 11.

The increased voltage gap Gap2 of the shut-off control signal BLSHF produces the effect of a threshold voltage of the memory cell being elevated. Namely, it renders a level of verifying voltage lower.

In this regard, according to some embodiments of the present invention, increasing the voltage gap of the shut-off control signal BLSHF may provide an effect of applying a negative voltage to the word line although 0V or a positive voltage close to 0V is applied thereto in the verify reading operation. This operational feature of the page buffer 201 is useful for verifying a post-programmed result by which a threshold voltage distribution of memory cells is partly or entirely conditioned in the negative voltage domain as like FIGS. 4A, 5B, or 5C. Additionally, this feature may be applicable to the normal reading operation for the erased state (i.e., ST0') of the programmed states shown in FIG. 7.

In some embodiments, as described above, the voltage gaps Gap1 and Gap2 of the shut-off control signal BLSHF are adjusted by raising a voltage level of the shut-off control signal BLSHF from Vprchg1 to Vprchg2 during the precharging period. The present invention, however, may not be limited hereto in adjusting the voltage gaps Gap1 and Gap2, for example, the voltage gaps Gap1 and Gap2 may be modified and/or altered in a variety of ways. For example, the voltage gaps Gap1 and Gap2 can be adjusted by decreasing the voltage $V_{BLSEN}$ of the shut-off control signal BLSHF that is applied to the gate of the NMOS transistor 235 during the sensing period.

As discussed above, in a conventional flash memory device, threshold voltages of adjacent memory cells may be most affected while programming a memory cell from an erased state to another programmed state. For the purpose of solving such a problem, the flash memory device according to some embodiments of the present invention conducts the erasing operation, which is composed of the main erasing operation and at least the two post-programming operations, before the programming operation. According to the erasing method of some embodiments, the threshold voltage distribution corresponding to the erased state is settled near to 0V and is narrow in width. For example, the threshold voltage distribution close to 0V may be formed of positive voltages adjacent to 0V or partly configured to have negative voltages. If the threshold voltage distribution extends into the negative domain, it is permissible to secure wider voltage margins between multiple programmed states. In addition, some embodiments further provide the verify reading operations for to extend the threshold voltage distribution to the negative domain. The verify reading methods according to some embodiments include extending a sensing range of a verifying voltage to the negative voltage domain without an additional negative voltage generator. In this case, the verifying voltage is physically 0V, but the memory cells respond as if a negative level of the verifying voltage is applied thereto. The sensing range of verifying voltage can be arranged by adjusting a voltage level of the shut-off control signal BLSHF.

If the threshold voltage distribution of the erased state is conditioned close to 0V by the post-programming, the variation of threshold voltages from the erased state to another programmed state may be reduced. A reduced variation of threshold voltages may result in less change to adjacent memory cells via capacitive couplings. Thus, a source that may significantly affect the capacitive couplings by the adjacent memory cells may be eliminated, thereby preventing data sensing errors.

Figure 12:
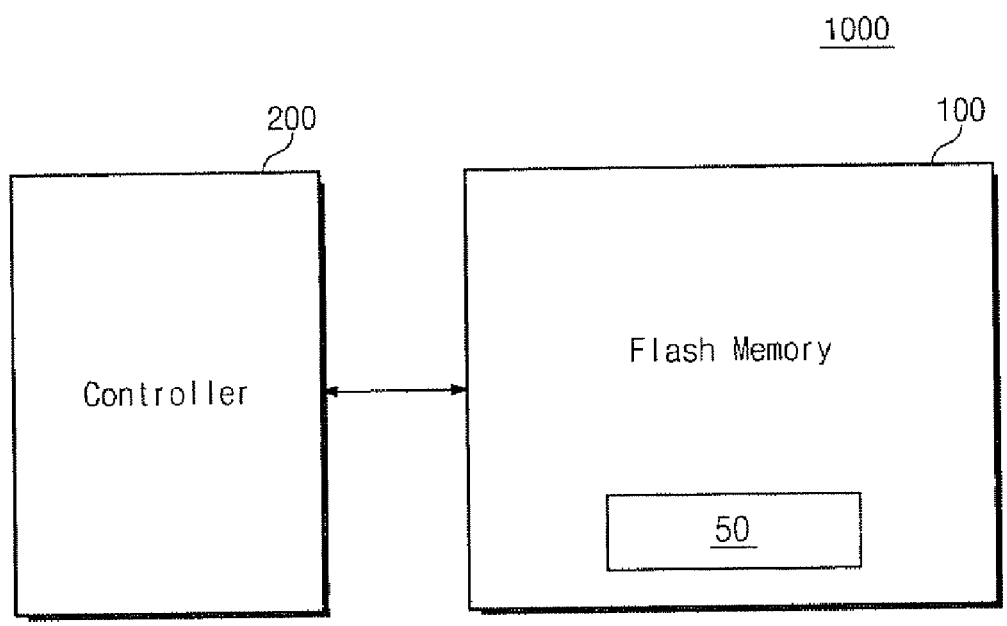
FIG. 12 is a block diagram of a memory system including the flash memory device shown in FIG. 1.

Reference is now made to FIG. 12, which is a block diagram of a memory system 1000 including the flash memory device 100 shown in FIG. 1. The memory system 100 includes the flash memory device 100 and a controller 200. As the flash memory device 100 is substantially configured in the same structure with that shown in FIG. 1, further discussion regarding the configuration will be omitted. The controller 200 is operable to control the flash memory device 100. The flash memory device 100 is configured to conduct the programming and reading operations after erasing memory blocks by way of the aforementioned erasing methods. The erasing operation is composed of the main erasing operation and the first and second post-programming operations. The controller 200 or a control circuit 50 of the flash memory device 100 determines voltages to be used for the main erasing operation and the first and second post-programming operations, specifically, voltage levels of the shut-off control signal BLSHF to be applied during the precharging and sensing periods of the verify reading operation.

The flash memory system 1000 shown in FIG. 12 may comprise a nonvolatile solid state disk (SSD). In this case, the controller 200 may be operated as a memory controller. Further, the flash memory system 1000 shown in FIG. 12 may comprise a memory card and/or memory card system. The controller 200 may be configured to communicate data with an external system (e.g., host) via one or more of various interface protocols including Universal Serial Bus (USB), MultiMedia Card Peripheral Circuit Interface Express (MMC PCI-E), Advanced Technology Attachment (ATA), serial-ATA, parallel-ATA, Small Computer System Interface (SCSI), Serial Attached SCSI(SAS), Enhanced Small Disk Interface (ESDI), and/or Integrated Drive Electronics (IDE), among others. The flash memory devices include nonvolatile memories capable of keeping data stored therein even without power supply. As such, flash memory devices are widely employed as code and/or data storage that retains data regardless of power supply. The flash memory devices can be used in mobile apparatuses such as cellular phones, personal digital assistants (PDA), digital cameras, portable gaming consoles, and/or MP3 players, among others. The flash memory devices may be also utilized in home applications such as high-definition TVs, digital versatile disks (DVDs), routers, and/or global positioning systems (GPSs), among others.

Figure 13:
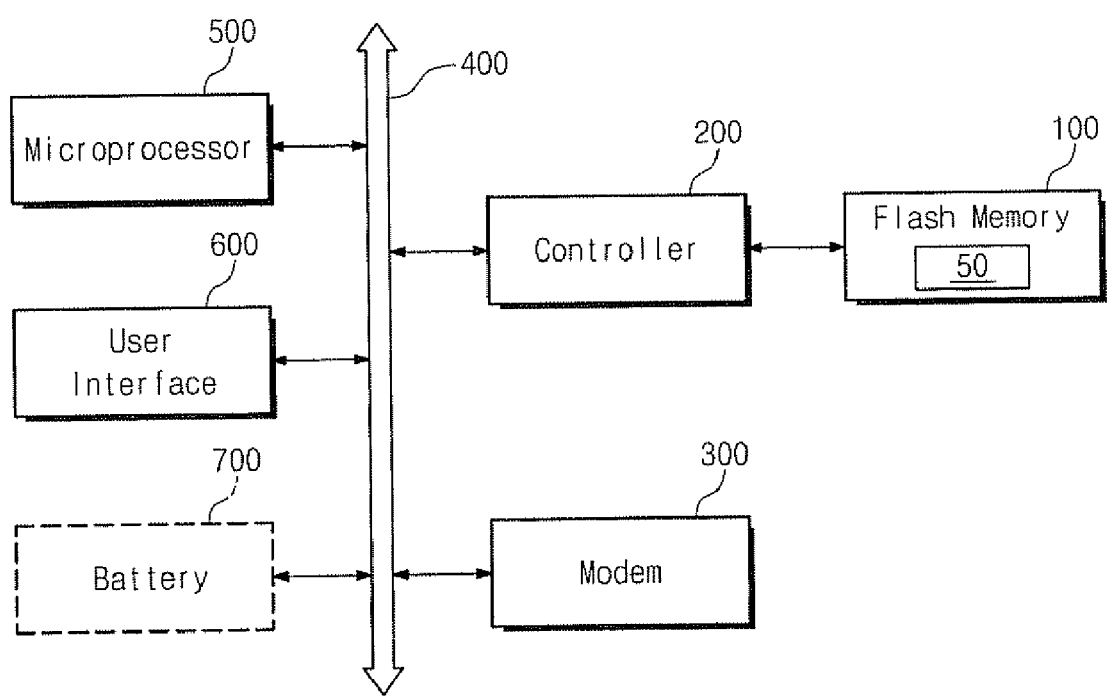
FIG. 13 is a block diagram of a computing system with a flash memory device according to some embodiments of the present invention.

Reference is made to FIG. 13, which is a block diagram of a computing system 2000 with the flash memory device 100 according to some embodiments of the present invention. The computing system 2000 according to some embodiments includes the flash memory device 100, the controller 200, a modem 300 such a baseband chipset, and a user interface, all of which may be connected to each other by way of a bus 400. The flash memory device 100 shown in FIG. 13 may be configured substantially as same as that shown in FIG. 1. In the flash memory device 100, N-bit data (1 is a positive integer) processed or to be processed by the microprocessor 400 are stored through the controller 200.

The flash memory device 100 is configured to conduct the programming and reading operations after erasing memory blocks by way of the aforementioned erasing methods. The erasing operation includes the main erasing operation and the first and second post-programming operations. According to erasing methods described herein, threshold voltages of the erased state are distributed near to 0V and their distribution width becomes narrower. While programming erased memory cells, variation of threshold voltages due to capacitive couplings between adjacent cells may be minimized. Voltages to be used for the erasing operation and post-programming operations are selected by the controller 200 or the control circuit 50 of the flash memory device 100.

If the computing system 2000 shown in FIG. 13 comprises a mobile apparatus, a battery 700 for supplying power thereto may be included. Although not shown in FIG. 13, the computing system 2000 may be equipped with an application chipset, a camera image processor (e.g., complementary metal-oxide-semiconductor (CMOS) image sensor; i.e., CIS), and/or a mobile DRAM, among others. For instance, the controller 200 and the flash memory device 100 may form a nonvolatile solid state disk (SSD).

The flash memory 100 and/or the controller 200 according to some embodiments of the present invention may be placed on the computing system 200 via a variety of package types including Package-on-Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip-On-Board (COB), CERamic Dual In-line Package (CERDIP), Plastic Metric Quad Flat Pack (MQFP), Thin Quad Flat Pack (TQFP), Small Outline (SOIC), Shrink Small Outline Package (SSOP), Thin Small Outline (TSOP), Thin Quad Flat Pack (TQFP), System In Package (SIP), Multi-Chip Package (MCP), Wafer-level Fabricated Package (WFP), Wafer-level Processed Stack Package (WSP), and/or Wafer-level Processed Package (WSP), among others. In some embodiments, the memory cells of the flash memory device 100 may be structured in various forms having charge storage layers. A charge storage architecture of the flash memory device may be implemented by including charge-trapping layers, stacked cell arrays where plural cell arrays are stacked, flash structures without source and drain regions, and/or pin-type flash structures, among others.

Although the present invention has been described in terms of specific embodiments, the present invention is not intended to be limited by the embodiments described herein. Thus, the scope may be determined by the following claims.

What is claimed is:

1. An erasing method for a flash memory device, comprising:
    erasing a plurality of memory cells of a selected memory block; and
    post-programming the erased plurality of memory cells to have a threshold voltage distribution with a lowest level that is in a voltage range that is near 0V,
    wherein the lowest level is a negative voltage that is near 0V,
    wherein post-programming the plurality of erased memory cells comprises:
    first post-programming the plurality of memory cells in the memory block in one operation wherein the memory block is first programmed as a unit by verify reading a result of the first post-programming with a predetermined verifying voltage; and
    second post-programming the plurality of memory cells in the memory block in groups according to word lines by verify reading a result of the second post-programming with a predetermined verifying voltage, wherein the memory block is second programmed in the unit of word line,
    wherein if there is an increase of voltage gap between a level of a control signal for controlling a precharging level of a selected bit line during a precharging period of the verify reading and a level of the control signal applied during a sensing period of the verify reading, recognizing the verifying voltage as a negative voltage, and
    wherein, during the sensing period, the verifying voltage is decreased and the level of the control signal applied is decreased.

2. The method as set forth in claim 1, wherein the lowest level is in a voltage range from 0V to a positive voltage that is near 0V.

3. The method as set forth in claim 1, wherein first post-programming the plurality of memory cells comprises simultaneously applying a program voltage to all of a plurality of word lines corresponding to the memory block.

4. The method as set forth in claim 1, wherein second post-programming the plurality of memory cells comprises sequentially applying a program voltage to a selected ones of the plurality of word lines corresponding to the memory block.

5. The method as set forth in claim 1, wherein the verifying voltage is in a voltage range between 0V and a positive voltage near 0V.

6. An erasing method for a flash memory device, comprising:
  erasing a plurality of memory cells of a selected memory block; and
  post-programming the erased plurality of memory cells to have a threshold voltage distribution with a lowest level that is in a voltage range that is near 0V,
  wherein post-programming the plurality of erased memory cells comprises:
    first post-programming the plurality of memory cells in the memory block in one operation wherein the memory block is first programmed as a unit; and
    second post-programming the plurality of memory cells in the memory block in groups according to word lines, wherein the memory block is second programmed in the unit of word line,
  wherein first post-programming the plurality of memory cells comprises verify reading a result of the first post-programming with a predetermined verifying voltage,
  wherein second post-programming the plurality of memory cells comprises verify reading a result of the second post-programming with a predetermined verifying voltage,
  wherein if there is an increase of voltage gap between a level of a control signal for controlling a precharging level of a selected bit line during a precharging period of the verify reading and a level of the control signal applied during a sensing period of the verify reading, recognizing the verifying voltage as a negative voltage, and
  wherein, during the precharging period, the verifying voltage is decreased and the level of the control signal applied is increased.

7. A flash memory device comprising:
  a memory cell array including a plurality of memory blocks, wherein each of the plurality of memory blocks includes a plurality of memory cells;
  a control circuit that is operable to control a post-programming operation of erased memory cells to have a threshold voltage distribution with a lowest level that is in a voltage range that is near 0V;
  a voltage generator that is operable to generate a plurality of voltages that are used for the post-programming operation and a verify reading to the post-programming operation in response to control by the control circuit; and
  a read/write circuit that is operable to conduct the post-programming operation and verify reading in response to control by the control circuit,
  wherein if there is an increase of voltage gap between a level of a control signal for controlling a precharging level of a selected bit line during a precharging period of the verify reading and a level of the control signal applied during a sensing period of the verify reading, a verifying voltage for the verify reading includes a negative voltage, and
  wherein, during the precharging period, the level of the verifying voltage decreases and the level of the control signal applied increases.

8. The flash memory device as set forth in claim 7, wherein the lowest level is in a voltage range from 0V to a positive voltage that is near 0V.

9. The flash memory device as set forth in claim 7, wherein the lowest level is in a voltage range from a negative voltage near 0V to 0V.

10. The flash memory device as set forth in claim 7, wherein the control circuit is further operable to conduct a first post-programming for the memory block as a unit of memory block, wherein the first post-programming is conducted for each of the plurality of memory cells corresponding to the memory block as a unit, and
  wherein the control circuit is further operable to conduct a second post-programming for the memory block as a unit of each of a plurality of word lines, wherein the second post-programming is conducted for each of the plurality of memory cells corresponding to the memory block corresponding to each of the plurality of word lines.

11. The flash memory device as set forth in claim 10, wherein the control circuit controls the first post-programming to simultaneously apply a program voltage to all of the plurality of word lines of the memory block.

12. The flash memory device as set forth in claim 10, wherein the control circuit controls the second post-programming to sequentially apply a program voltage to a selected ones of the plurality of word lines belonging to the memory block.

13. The flash memory device as set forth in claim 7, wherein the verifying voltage for the verify reading is in a voltage range from 0V to a positive voltage that is near 0V.

14. The method as set forth in claim 1, wherein the lowest level is in a voltage range from 0V to a positive voltage that is near 0V.

15. The method as set forth in claim 1, wherein the lowest level is a negative voltage that is near 0V.

16. The method as set forth in claim 1, wherein first post-programming the plurality of memory cells comprises simultaneously applying a program voltage to all of a plurality of word lines corresponding to the memory block.

17. The method as set forth in claim 1, wherein second post-programming the plurality of memory cells comprises sequentially applying a program voltage to a selected ones of the plurality of word lines corresponding to the memory block.

18. The method as set forth in claim 1, wherein the verifying voltage is in a voltage range between 0V and a positive voltage near 0V.

* * * * *